(12) United States Patent
Bataillou et al.

(10) Patent No.: US 10,706,718 B2
(45) Date of Patent: Jul. 7, 2020

(54) REMOTE CONTROL DEVICE

(71) Applicant: Apple Inc., Cupertino, CA (US)

(72) Inventors: Jeremy D. Bataillou, Cupertino, CA (US); Keith J. Hendren, San Francisco, CA (US); Nicholaus Lubinski, San Francisco, CA (US); Ryan P. Brooks, Cupertino, CA (US); John M. Brock, Menlo Park, CA (US); Wayne W. Huang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/265,821

(22) Filed: Feb. 1, 2019

(65) Prior Publication Data

US 2019/0172341 A1    Jun. 6, 2019

Related U.S. Application Data

(63) Continuation of application No. 14/913,916, filed as application No. PCT/US2014/052413 on Aug. 22, 2014, which is a continuation of application No. 13/974,620, filed on Aug. 23, 2013, now abandoned.

(51) Int. Cl.
*G08C 19/28* (2006.01)
*G08C 17/02* (2006.01)
*H01H 13/785* (2006.01)
*H03K 17/96* (2006.01)

(52) U.S. Cl.
CPC .............. *G08C 19/28* (2013.01); *G08C 17/02* (2013.01); *H01H 13/785* (2013.01); *H01H 2201/036* (2013.01); *H03K 17/9625* (2013.01)

(58) Field of Classification Search
CPC ...... G08C 19/28; G08C 17/02; H01H 13/785; H01H 2201/036; H03K 17/9625
See application file for complete search history.

(56) References Cited

U.S. PATENT DOCUMENTS

| | | |
|---|---|---|
| 6,135,886 A | 10/2000 | Armstrong |
| 6,208,271 B1 | 3/2001 | Armstrong |
| 7,554,167 B2 | 6/2009 | Vaganov |
| 8,316,725 B2 | 11/2012 | Wade |
| 8,450,627 B2 | 5/2013 | Mittleman et al. |
| 8,581,870 B2 | 11/2013 | Bokma et al. |
| 8,700,829 B2 | 4/2014 | Casparian et al. |

(Continued)

FOREIGN PATENT DOCUMENTS

| | | |
|---|---|---|
| CN | 1502090 A | 6/2004 |
| CN | 1582452 A | 2/2005 |

(Continued)

*Primary Examiner* — Thomas D Alunkal
(74) *Attorney, Agent, or Firm* — Dorsey & Whitney LLP

(57) ABSTRACT

A remote control device includes a housing and an upper element. The top surface of the upper element can be partitioned to include different frictionally engaging surfaces. At least one frictionally engaging surface can be used as an input surface that receives user inputs such as touch or force inputs. An input device, such as a force sensing switch, can be positioned in the housing and used in determining an amount of force applied to the input surface. The bottom surface of the upper element below the second surface can be affixed to the housing in a manner that permits the input surface to bend based on the applied force.

19 Claims, 15 Drawing Sheets

(56) References Cited

U.S. PATENT DOCUMENTS

| | | | |
|---|---|---|---|
| 8,963,857 B2 * | 2/2015 | Kim | G06F 3/0487 345/173 |
| 9,003,899 B2 | 4/2015 | Wade | |
| 9,182,837 B2 | 11/2015 | Day | |
| 9,239,594 B2 * | 1/2016 | Lee | G06F 1/1652 |
| 2001/0017592 A1 | 8/2001 | Armstrong | |
| 2003/0227441 A1 * | 12/2003 | Hioki | G06F 3/0412 345/156 |
| 2006/0060459 A1 * | 3/2006 | Kaneo | H01H 25/041 200/181 |
| 2010/0328230 A1 * | 12/2010 | Faubert | G06F 1/1626 345/173 |
| 2011/0003550 A1 | 1/2011 | Klinghult et al. | |
| 2011/0187575 A1 * | 8/2011 | Nakamura | H04L 17/02 341/176 |
| 2011/0241442 A1 | 10/2011 | Mittleman et al. | |
| 2013/0067126 A1 | 3/2013 | Casparian et al. | |
| 2013/0141342 A1 * | 6/2013 | Bokma | G06F 3/0338 345/173 |
| 2013/0222416 A1 * | 8/2013 | Kim | G09G 3/20 345/619 |
| 2013/0247690 A1 | 9/2013 | Wade | |
| 2013/0292237 A1 | 11/2013 | Arai et al. | |
| 2014/0176457 A1 * | 6/2014 | Kim | G06F 3/0416 345/173 |
| 2014/0268628 A1 * | 9/2014 | Mann | G08C 17/00 362/23.1 |
| 2016/0203710 A1 | 7/2016 | Bataillou et al. | |
| 2016/0358737 A1 | 12/2016 | Brooks et al. | |

FOREIGN PATENT DOCUMENTS

| | | |
|---|---|---|
| CN | 101414518 A | 4/2009 |
| DE | 10241220 C1 | 10/2003 |
| EP | 1691257 A1 | 8/2006 |
| FR | 2940707 A1 | 7/2010 |
| JP | 2006120550 A | 5/2006 |
| KR | 2002972770000 | 11/2002 |
| KR | 20040013742 A | 2/2004 |
| KR | 20110030427 A | 3/2011 |
| KR | 101044036 B1 | 6/2011 |
| KR | 20130091208 A | 8/2013 |
| WO | 9309553 A1 | 5/1993 |
| WO | 0145123 A1 | 6/2001 |

\* cited by examiner

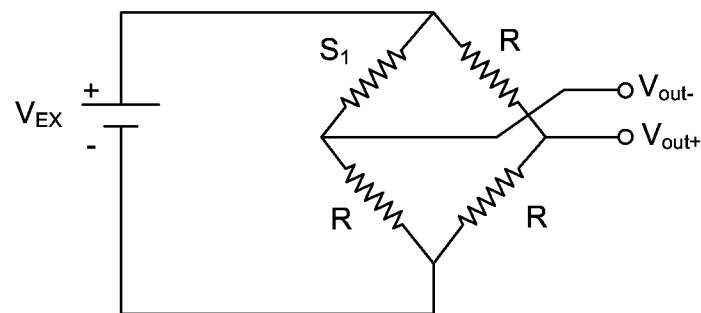
FIG. 6
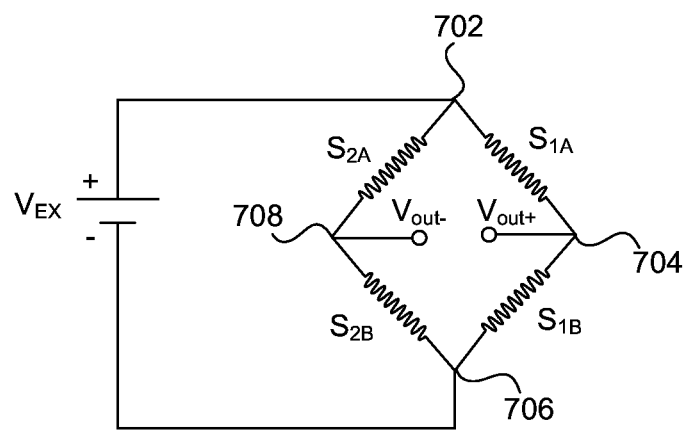
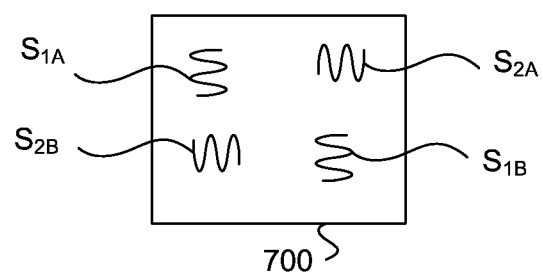
FIG. 7

REMOTE CONTROL DEVICE

CROSS-REFERENCE TO RELATED APPLICATION(S)

This application is a continuation of U.S. patent application Ser. No. 14/913,916, filed Feb. 23, 2016 and titled "Remote Control Device," which is a 35 U.S.C. § 371 application of PCT Patent Application No. PCT/US2014/052413, filed Aug. 22, 2014 and titled "Remote Control Device," which claims priority to U.S. non-provisional application Ser. No. 13/974,620, filed Aug. 23, 2013, and titled "Remote Control Device," the contents of which are incorporated herein by reference in their entireties.

TECHNICAL FIELD

The present invention relates to input devices, and more particularly to remote control devices for controlling an electronic device. Still more particularly, the present invention relates to a remote control device that includes one or more input devices.

BACKGROUND

Remote control devices are used to control various electronic devices such as televisions, DVD players, stereos, and game consoles. Typically, the remote control device includes multiple buttons that can be pressed by a user to interact with the electronic device, or to interact with a program or application displayed on the electronic device itself or on a second electronic device connected to the electronic device. Many of these buttons provide a binary input for user interaction in that the buttons either register an input or they do not. Some applications and remote control devices may benefit from additional inputs beyond that provided strictly by binary input devices. For example, it may be advantageous for a user to be able to indicate an amount of force applied to a touch input surface of a remote control device. For instance, a user could manipulate a screen element or other object in a first way with a relatively light touch or in a second way with a relatively more forceful touch.

SUMMARY

In one aspect, a remote control device includes a housing comprising a bottom surface coupled to adjoining side walls extending up from the bottom surface to form an interior cavity, and an upper element configured to upper element the interior cavity.

The upper element can include a top surface that includes different frictionally engaging surfaces, including at least one textured surface and a second surface. One or more input devices can be disposed in the interior cavity. For example, a force sensing switch can be positioned in the interior cavity under either a textured surface or the second surface. The force sensing switch can include a dome switch disposed over a top surface of a deflectable beam, where the dome switch includes a deformable structure configured to deform when a force is applied to the first textured surface or to the second surface. One or more strain gauges can be positioned over at least one surface of the deflectable beam and configured to sense a strain in the deflectable beam based on the force applied to the textured surface. For example, a strain gauge can be placed over the top surface and the bottom surface of the beam, or four strain gauges can be disposed over the top surface of the deflectable beam. A processing device can determine the amount of force applied to the textured surface based on at least one strain measurement received from a strain gauge or gauges. In some embodiments, only a portion of the bottom surface of the upper element is connected to the housing to permit the textured surface to bend based on a force applied to the textured surface. For example, only the bottom surface under the second surface can be connected to the housing.

In another aspect, a method of producing the remote control device can include providing at least one input device in an interior cavity of the housing. The input device is a force sensing switch in some embodiments. An upper element is provided over the interior cavity. The upper element can include a top surface that includes different frictionally engaging surfaces, including at least one textured surface and a second surface. An input device can be located under the textured surface. A portion of the bottom surface of the upper element can be affixed to the housing so that the textured surface is able to bend based on a force applied to the textured surface. For example, in some embodiments, only the bottom surface under the second surface can be connected to the housing.

In yet another aspect, a method of producing an upper element for the remote control device can include applying a first masking material to a top surface of the upper element to define a first surface not covered by the first masking material and a second surface covered by the first masking material. A first textured surface is then produced in the first surface. For example, the first surface can be etched and polished or a mechanical polishing can be used to produce the first textured surface. The first masking material can be removed and one or more openings can be formed through the glass upper element. At least one of the one or more openings is configured to receive an input button. When the upper element is to include more than one textured surface, prior to forming the opening(s), a second masking material can be applied to an area of the second surface of the glass upper element to define a third surface not covered by the second masking material. A second textured surface then can be produced and the second masking material removed.

In another aspect, a method for producing a roughness in a surface of a glass upper element of a remote control device can include producing the roughness in a portion of the surface of the glass upper element by abrasively etching the portion with a mixture of glass beads and a liquid, and polishing the portion to modify the roughness in the portion of the surface of the glass upper element.

And in yet another aspect, a remote control device includes a housing comprising a bottom surface coupled to adjoining side walls extending up from the bottom surface to form an interior cavity, and an upper element configured to upper element the interior cavity. The upper element can include a top surface that includes different frictionally engaging surfaces, including at least one textured surface and a second surface. One or more input devices can be disposed in the interior cavity. For example, a force sensing switch can be positioned in the interior cavity under either a textured surface or the second surface. The force sensing switch can include a dome switch disposed over a top surface of a deflectable beam, where the dome switch includes a deformable structure configured to deform when a force is applied to the first textured surface or to the second surface. An electrode can be positioned below a bottom surface of the deflectable beam, where the bottom surface of the deflectable beam and the electrode form a capacitive sensing element. A processing device can determine the amount of force applied to the textured surface based on at least one capacitance measurement.

In some embodiments, only a portion of the bottom surface of the upper element is connected to the housing to permit the textured surface to bend based on a force applied to the textured surface. For example, only the bottom surface under the second surface can be connected to the housing.

BRIEF DESCRIPTION OF THE DRAWINGS

Embodiments are better understood with reference to the following drawings. The elements of the drawings are not necessarily to scale relative to each other.

Identical reference numerals have been used, where possible, to designate identical features that are common to the figures.

FIGS. 6-8 are circuit diagrams of different types of strain gauge configurations that can be used in a force sensing switch;

DETAILED DESCRIPTION

Figure 1:
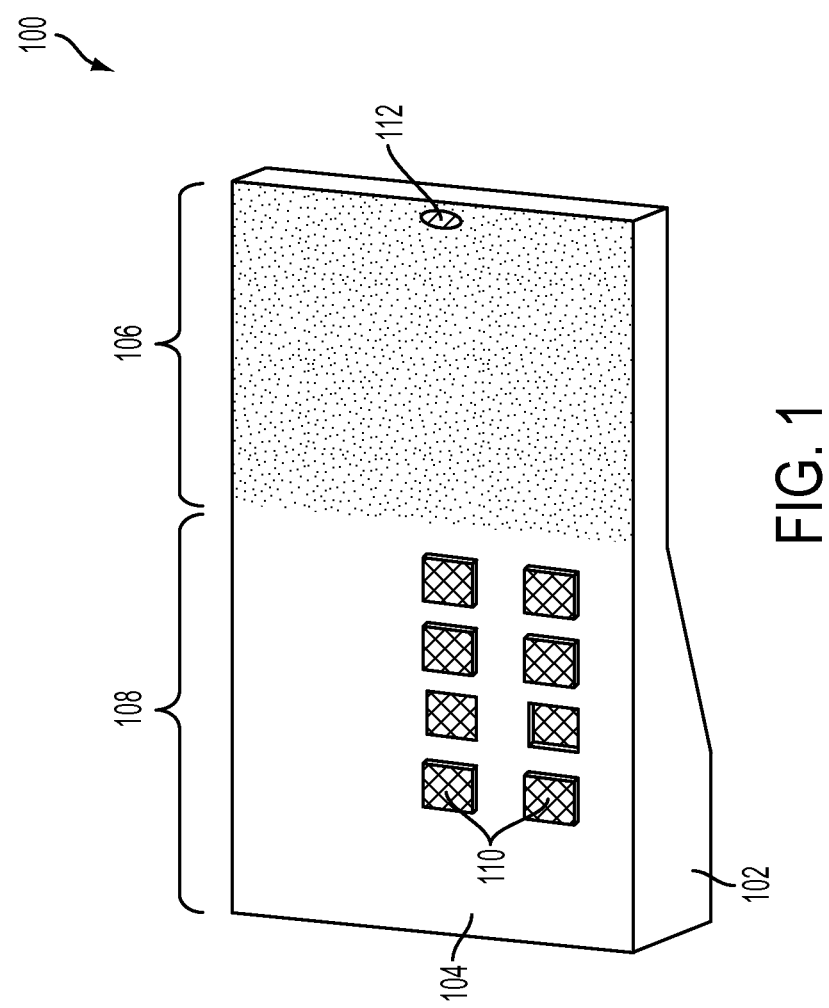
FIG. 1 is an isometric view of one example of a remote control device that can include one or more force sensing switches.

Embodiments described herein provide a remote control device that can be used with networked devices, such as computers, tablet computing devices, and video streaming media devices. One suitable non-limiting example of a networked device is a streaming media player. The remote control device includes an upper element having different frictionally engaging surfaces, including at least one textured surface and a second surface. The at least one textured surface can receive user inputs, such as a touch and/or force input. A force sensing switch can be positioned in a housing of the remote control device and provide an analog input based on the amount of applied force. In other words, the force sensing switch is not binary in that the force sensing switch does not register an input or not register an input. The force sensing switch can have multiple output states or signal levels based on the amount of force applied to the upper element.

A force sensing switch can include one or more dome switches and one or more strain gauges disposed over a top surface of a deflectable beam. When a downward force is applied to an input surface, the downward force is also applied to the dome switch and to the deflectable beam. The force can cause a deformable structure in the dome switch to compress, which in turn causes the deflectable beam to deflect or strain based on the applied force. The amount of beam strain can vary depending on the amount of force applied to the input surface. The strain gauge(s) can measure the amount of beam strain, and a processing device operatively connected to the one or more strain gauges can determine the amount of force applied to the input surface based on a strain measurement received from at least one strain gauge.

A portion of the bottom surface of the upper element can be affixed to the housing in a manner that permits the textured surface to bend based on the applied force. For example, only the bottom surface under the second surface can be affixed to the housing, or to a trim within the housing. The textured surface is therefore able to bend at or near an interface between the affixed and non-affixed bottom surface in response to an applied force.

The upper element can further include one or more input buttons. The input buttons can provide for a variety of user inputs, such as volume control, channel control, a home button, a select button, navigation buttons, pause or play buttons, and a device or mode button. The input buttons can be flush with the surface, can protrude or extend beyond the surface, can be recessed with respect to the surface, or a combination of both in that some input buttons are flush or recessed while other input buttons protrude. Additionally or alternatively, the input buttons can have any given shape and/or surface to aid a user in identifying an input button and its function.

In some embodiments, the upper element of the remote control device includes multiple textured surfaces. A force sensing switch can be positioned below one textured surface and another input device, such as a trackpad, can be located under another textured surface.

Referring now to FIG. 1, there is shown a perspective view of a remote control device that can include one or more force sensing switches. The remote control device 100 includes a housing 102 and a glass upper element 104. Although the upper element 104 is described herein as a glass upper element, other embodiments can form the upper element with a different material or combination of materials, such as with a plastic, a metal, or various combinations of a glass, a plastic, or a metal.

The housing 102 is formed such that an interior cavity (not shown) is disposed between the bottom surface and the sidewalls of the housing 102. The interior cavity can include various structural, electrical and/or mechanical components. For example, the interior cavity can include a power source, a processing device, one or more microphones, a memory or data storage device, one or more wireless communication devices, and one or more connector ports. The housing 102 can be made of any suitable material or materials, such as a metal, a plastic, or a combination of materials.

The top surface of the glass upper element 104 can be partitioned to include at least two different frictionally engaging surfaces, including a textured surface 106 and a second surface 108. The textured surface 106 and the second surface 108 can have substantially the same dimensions, or the two surfaces can have different dimensions. Additionally, the textured surface 106 and the second surface 108 can be positioned at locations different from the locations shown in FIG. 1.

The second surface 108 can be smooth or include some texturing or covering. The textured surface 106 can be used for user inputs, such as a touch and/or a force input. A user's finger can move or slide more easily on or over the textured surface because the finger contacts a lesser amount of surface compared to a smooth surface. Additionally or alternatively, the second surface can be used for user inputs.

Openings (not shown) can extend through the second surface 108 and/or the textured surface 106 to provide for one or more input buttons 110. The input buttons can provide for a variety of user inputs, such as volume control, channel control, a home button, a select button, navigation buttons, pause or play buttons, and a device or mode button. The input buttons 110 can be formed with any suitable material, including metal or plastic. The input buttons can be flush with the surface, can be recessed with respect to the surface, can protrude or extend beyond the surface, or a combination of these configurations. For example, in some embodiments, the input buttons are flush while other input buttons protrude. Additionally or alternatively, the input buttons can have any given shape and/or surface. For example, an input button can have a textured, concave or convex surface while another input button has a smooth or flat surface. The input buttons can be shaped differently to assist a user in identifying the input buttons from one another. Raised symbols can be formed in the button surface; or the input buttons or an area around the input buttons can be illuminated to aid a user in identifying an input button and its function.

The glass upper element 104 can include one or more openings 112 for a microphone or speaker(s). Additionally or alternatively, the housing 102 can include an opening or openings (not shown) for a microphone or one or more speakers.

Figure 2:
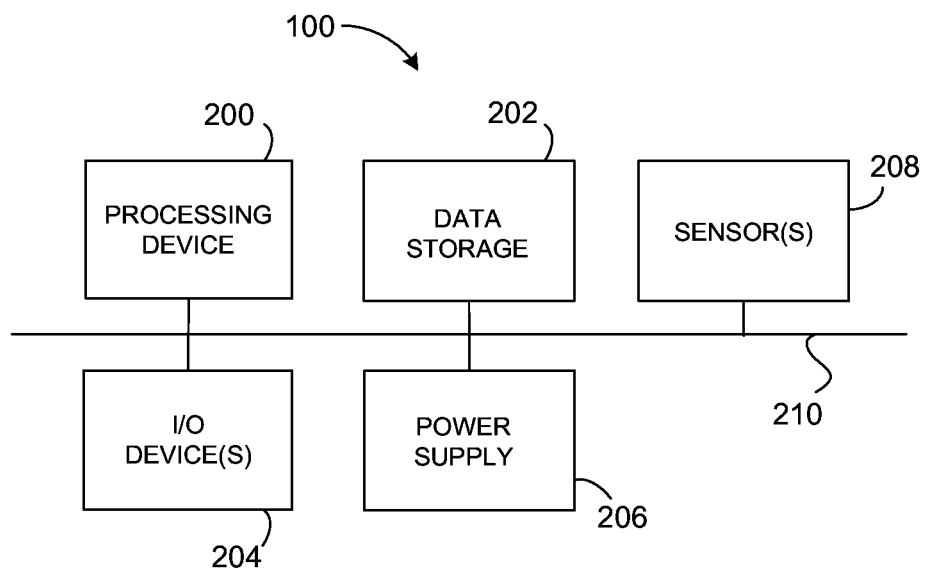
FIG. 2 is a block diagram of the remote control device shown in FIG. 1.

FIG. 2 is a block diagram of the remote control device shown in FIG. 1. The remote control device 100 can include one or more processing devices 200, one or more data storage devices 202, input/output (I/O) device(s) 204, a power source 206, and one or more sensors 208. The one or more processing devices 200 can control some or all of the operations of the remote control device 100. The processing device(s) 200 can communicate, either directly or indirectly, with substantially all of the components of the remote control device 100. For example, one or more system buses or signal lines 210 or other communication mechanisms can provide communication between the processing device(s) 200, the data storage device(s) 202, the I/O device(s) 204, the power source 206, and/or the sensor(s). The processing device(s) 200 can be implemented as any electronic device capable of processing, receiving, or transmitting data or instructions. For example, the one or more processing devices 200 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

The data storage device(s) 202 can store electronic data that can be used by the remote control device 100. For example, a data storage device can store electrical data or content such as, for example, audio files, settings and user preferences, and timing signals. The data storage device(s) 202 can be configured as any type of memory. By way of example only, the memory can be implemented as random access memory, read-only memory, Flash memory, removable memory, or other types of storage elements, in any combination.

The input/output device(s) 204 can receive data from a user or one or more other electronic devices. Additionally, the input/output device(s) 204 can facilitate transmission of data to a user or to other electronic devices. For example, an I/O device 204 can transmit electronic signals via a wireless or wired connection. Examples of wireless and wired connections include, but are not limited to, WiFi, Bluetooth, infrared, and Ethernet.

In other embodiments, the I/O device(s) 204 can include a display, a touch sensing input surface such as a trackpad, one or more buttons, one or more microphones or speakers, a keyboard, and/or a force sensing switch or switches. For example, a force sensing switch can be included in a button, the keys on a keyboard, and/or an input surface of the remote control device.

The power source 206 can be implemented with any device capable of providing energy to the remote control device 100. For example, the power source 206 can be one or more batteries or rechargeable batteries, or a connection cable that connects the remote control device to another power source such as a wall outlet.

The one or more sensors 208 can include any suitable type of sensor or sensors, such as a motion sensor, a proximity sensor, an orientation sensor (e.g., gyroscope), and/or an accelerometer.

Figure 3:
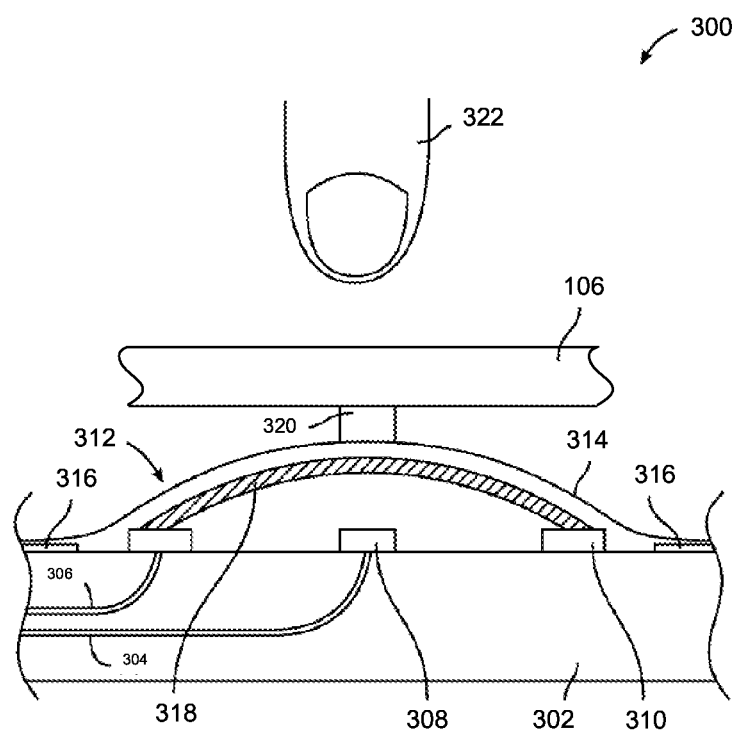
FIG. 3 is a simplified cross-section view of one example of a dome switch.

Referring now to FIG. 3, there is shown a simplified view of one example of a dome switch in an unactuated or relaxed position. The dome switch 300 includes a substrate 302, conductive traces 304 and 306 disposed within the substrate 302, an inner conductive contact 308, and an outer conductive ring 310. The substrate 302 can be any suitable type of substrate, such as a flexible circuit, a printed circuit board, a frame structure, or a housing wall. In the illustrated embodiment, the substrate is a flexible circuit. The conductive trace 304 is connected to the inner conductive contact 308 while the conductive trace 306 is connected to the outer conductive ring 310.

The dome switch 300 further includes a deformable structure 312. The deformable structure 312 is shaped as a dome in the illustrated embodiment, but other embodiments can shape the deformable structure differently. The deformable structure 312 can include a flexible outer material 314 and an adhesive 316 that connects the deformable structure 312 to the substrate 302. The flexible outer material can be made of any suitable flexible material, such as polyethylene terephthalate ("PET"). The underside of the flexible outer material 314 is coated with a conductive material 318 such as graphite or gold that is connected to the outer conductive ring 310. A contact structure 320 can be disposed between the underside of the textured surface 106 (FIG. 1) and the flexible outer material 314.

While in the unactuated state, the conductive material 318, the inner contact 308, and the outer contact ring 310 are not in contact with each other, causing the dome switch to be in an "open" or "off" state because a circuit formed through the conductive material 318, the inner contact 308, and the outer contact ring 310 is not complete. When a finger 322 presses down on the textured surface 106, the contact structure 320 pushes down on the deformable structure 312, which in turn causes the deformable structure 312 to compress such that the conductive material 318 makes contact with both the inner conductive contact 308 and the outer conductive ring 310. This action completes the circuit formed through the conductive material 318, the inner contact 308, and the outer contact ring 310 and places the dome switch in an actuated or "on" state.

Other embodiments can construct the dome switch 300 differently. For example, a deformable structure, such as a dome, can be arranged in an inverted position such that the base of the dome connects to an outer conductive ring affixed to an underside of an input surface. An inner conductive contact is also positioned on the underside of the input surface under the dome. An inner surface of the dome can be lined with a conductive material. In the unactuated state, the switch is in an "open" or "off" state because the dome is not collapsed and the conductive material inside the dome is not in contact with both the inner conductive contact and the outer conductive ring. The dome switch is actuated when a user presses down on the input surface and the inverted dome compresses such that the inner conductive contact and the outer conductive ring both make contact with the conductive material lining the inside of the dome. This action closes the circuit and places the switch in an "on" state.

Alternatively, in other embodiments, the dome switch can include a rubber dome positioned over a metal dome. The rubber dome can include a plunger portion that extends downward from the center of the underside of the rubber dome. The plunger portion is positioned over the center of the top of the metal dome. A membrane is disposed under the metal dome, and conductive contact pads are embedded in the membrane. In an unactuated state, the conductive contact pads are not in contact with each other and the switch is in an "off" state. To place the dome switch in an "on" state, a user presses down on an input surface to compress the rubber dome such that the plunger portion contacts and pushes down on the center of the top of the metal dome, which in turn causes the metal dome to collapse and push down on the membrane. The conductive contact pads connect and close the switch when the metal dome presses down on the membrane.

Figure 4:
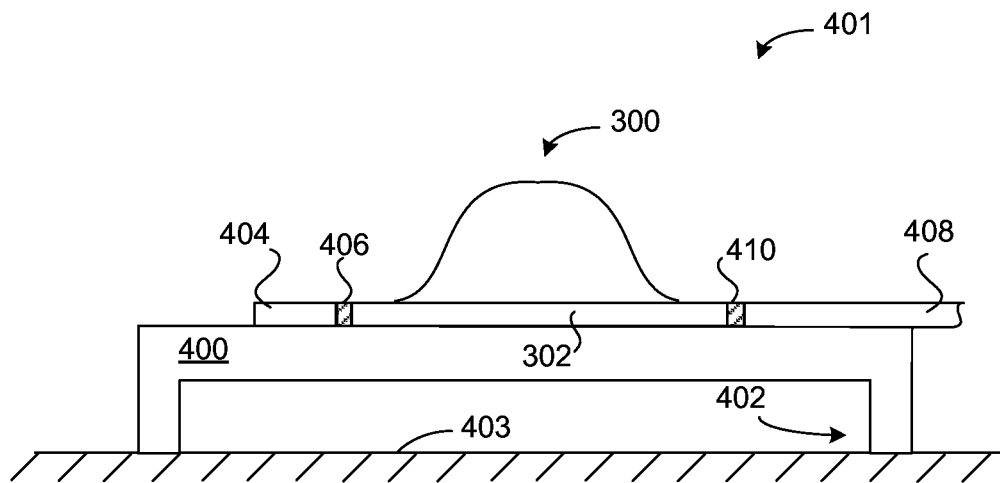
FIG. 4 is a simplified cross-section view of one example of a force sensing switch in a non-actuated state.
Figure 5:
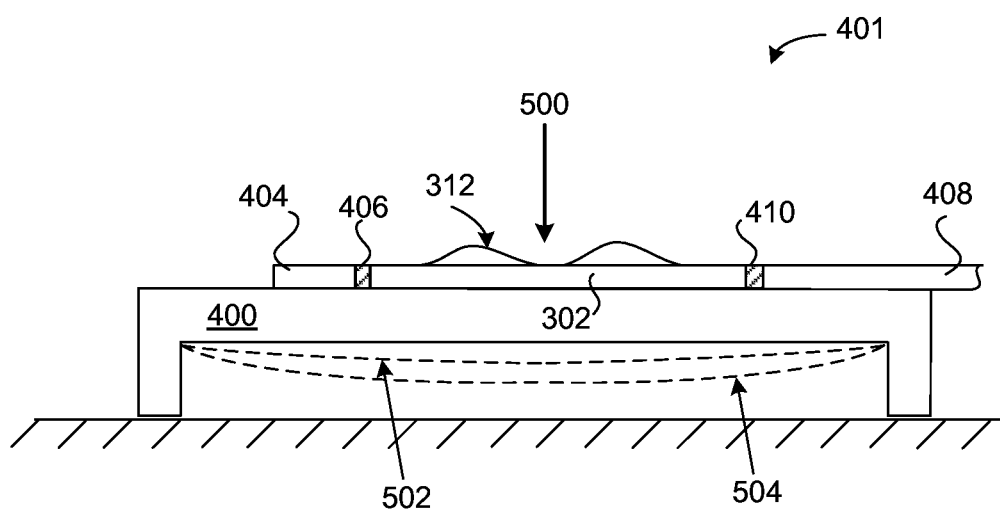
FIG. 5 is a simplified cross-section view of the force sensing switch 401 in an actuated state.

Embodiments of a force sensing switch include at least one dome switch, such as the dome switch 300. FIG. 4 depicts a simplified view of one example of a force sensing switch in an unactuated state, and FIG. 5 illustrates the force sensing switch 401 in an actuated state. The dome switch 300 is disposed over a top surface of a deflectable beam 400 (FIG. 4). Although only one dome switch is shown in the figures, embodiments can position one or more dome switches over the top surface of the deflectable beam.

In one embodiment, the deflectable beam 400 is shaped similar to a table or stool with support structures 402 extending out and under the deflectable beam and connecting to a component or surface in the electronic device. In other embodiments, the deflectable beam can be constructed differently. By way of example only, the deflectable beam can be configured as a cantilevered beam.

The deflectable beam 400 is affixed to a structure 403. By way of example only, the structure 403 can be a surface of a frame or enclosure, or the structure can be a separate element that is affixed to the frame or enclosure. Any suitable method can be used to affix the deflectable beam 400 to the structure 403, such as, for example, an adhesive or a fastener. In some embodiments, the deflectable beam 400 can be molded with the enclosure such that the enclosure and deflectable beam are one piece.

One or more strain gauges 404 can be disposed over the top surface of the deflectable beam adjacent to, or around the dome switch 300. Additionally or alternatively, in other embodiments one or more strain gauges 404 can be placed over other surfaces of the deflectable beam 400. For example, one or more strain gauges can be disposed over the bottom surface of the deflectable beam between the two support structures 602. In such embodiments, a strain gauge or gauges can also be located over the top surface of the deflectable beam 400.

As described earlier, the substrate 302 is a flexible circuit or a printed circuit board in some embodiments. In the illustrated embodiment, a conductive connector 406 can operatively connect the strain gauge 404 to the flexible circuit or printed circuit board substrate 302. Another flexible circuit 408 can be disposed over the top surface of the deflectable beam in one embodiment. A second conductive connector 410 can operatively connect the flexible circuit substrate 302 of the dome switch to the flexible circuit 408. The flexible circuit 408 can connect to a processing device or a main logic board (not shown). In other embodiments, a main logic board that includes a processing device can be positioned over the top surface of the deflectable beam 400, and the second conductive connector 410 can operatively connect the flexible circuit substrate 302 of the dome switch to the main logic board. And in other embodiments, the flexible circuit 408 can be omitted and the flexible circuit substrate 302 can connect to a processing device or main logic board.

When a downward force (represented by arrow 500) is applied to the textured surface (not shown) of the remote control device, the downward force is also applied to the deformable structure 312 and to the deflectable beam 400. The downward force can be sufficient to collapse the deformable structure 312 and actuate the dome switch, or the force can be insufficient to actuate the dome switch but still compress the deformable structure 312. Either way, the deflectable beam 400 deflects based on the applied force. Different amounts of beam deflection are represented by dashed lines 502 and 504. Dashed line 502 represents a small amount of beam deflection while dashed line 504 a greater amount of beam deflection. The strain gauge or gauges 404 can be used to measure the amount of beam strain. For example, each strain gauge can output a signal representative of the amount of beam strain measured by the strain gauge.

Figure 8:
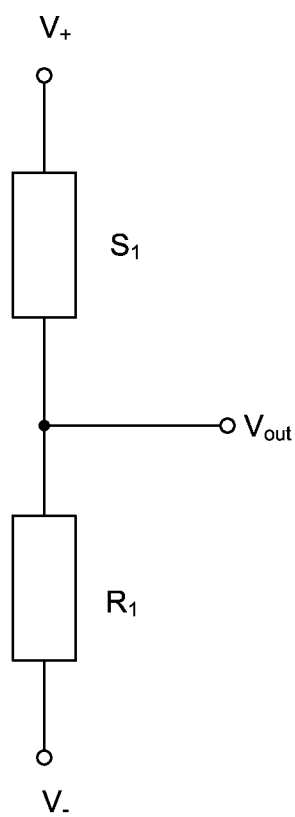

The signal or signals from the one or more strain gauges can be transmitted to a processing device or the main logic board using the conductive connector 406, the flexible circuit 302, the conductive connector 410, and the flexible circuit 408. The processing device can determine an amount of force that was applied to the textured surface based on the amount of strain measured by at least one strain gauge 404. Embodiments can use any suitable type of strain gauge, including a mechanical, a resistive, a capacitive, and an optical strain gauge. By way of example only, a semiconductor strain gauge or a bonded metallic strain gauge can be used. FIGS. 6-8 illustrate different types of strain gauges that can be used in a force sensing switch in one or more embodiments.

In some embodiments, the dome switch 300 can be used to test and/or calibrate the force sensing switch 401. For example, the dome switch may collapse at a known and reproducible force. When a collapse of the dome switch is detected by the force sensing switch changing from the "off" state to the "on" state, the strain measured by at least one strain gauge can then be calibrated at this force. Since strain gauges are largely linear, strain readings at zero load and at the dome switch collapse force are sufficient to calibrate the force sensing switch 401.

In some embodiments, the force sensing switch is not operable unless the dome switch 300 is actuated. Once the dome switch is actuated, the processing device determines the amount of applied force based on a signal received from at least one strain gauge. In other embodiments, the force sensing switch operates regardless of whether the dome switch is actuated or not. Based on the applied force, the dome switch either compresses (no actuation) or is actuated, and in both cases the processing device determines the amount of applied force based on a signal received from at least one strain gauge.

The deflectable beam 400 can be formed of a material or a combination of materials that allow the beam to strain only to a maximum point (e.g., dashed line 504), thereby preventing the deflectable beam from straining too far and breaking or becoming inoperable. For example, the deflectable beam 400 can be made of steel, aluminum, glass, and/or a plastic. Additionally or alternatively, a structure (not shown) having a height that is less than the underside of the deflectable beam can be positioned below the beam 400 to prevent the deflectable beam from deflecting too far. The underside of the deflectable beam can strain only as far as the top surface of the structure under the beam. Thus, the deflectable beam 400 can have a maximum amount of deflection, which means each strain gauge has a limit on the amount of strain the gauge can measure. Once the deflectable beam reaches maximum deflection, the strain gauge or gauges will not measure any more strain, even when additional force (more force than needed to reach maximum deflection) is applied to the input surface.

FIGS. 6-8 are circuit diagrams of different types of strain gauge configurations that can be used in a force sensing switch. In FIG. 6, a strain gauge S1 and three constant resistors R are connected in a full Wheatstone bridge. A Wheatstone bridge is an electrical circuit used to measure an unknown electrical resistance by balancing two legs of a bridge circuit. One leg includes an unknown component and three legs are formed by a resistor having a known electrical resistance. In the illustrated embodiment, an output voltage $V_{OUT}$ is generated when a voltage supply $V_{EX}$ is applied to the circuit. When a force is applied to the deflectable beam and the beam deflects, a strain is generated that changes the resistance of the strain gauge S1 and changes the output voltage $V_{OUT}$.

FIG. 7 shows a circuit diagram of another type of strain gauge configuration. Four strain gauges $S_{1A}$, $S_{1B}$, $S_{2A}$, and $S_{2B}$ are electrically connected in a full Wheatstone bridge. In this configuration, the four strain gauges replace the three known resistors and the one unknown component. Instead of balancing the resistors to get a nearly zero output, a voltage output $V_{OUT}$ is generated with the resistances of the strain gauges $S_{1A}$, $S_{1B}$, $S_{2A}$, $S_{2B}$. A force applied to the deflectable beam introduces a strain that changes the resistance in each strain gauge. The output voltage $V_{OUT}$ produced when a voltage supply $V_{EX}$ is applied to the circuit changes when the resistances in the strain gauges changes.

The strain gauges can be arranged as shown in area 700. The strain gauges can be co-located such that $S_{1A}$ and $S_{1B}$ detect the strain parallel to one axis (e.g., central X-axis 916 in FIG. 9) and $S_{2A}$ and $S_{2B}$ detect the Poisson strain generated by the strain parallel to the X-axis.

In FIG. 8, a strain gauge $S_1$ and a constant resistor $R_1$ are connected in series. This configuration is commonly called a half-bridge. The resistor $R_1$ is chosen to be nearly equal to the resistance of the strain gauge $S_1$ so that the output voltage $V_{OUT}$ generally lies midway between V+ and V−. When a force is applied to the force sensing switch, the deflectable beam deflects and a strain is generated at the strain gauge $S_1$. The strain at the strain gauge $S_1$ changes the resistance of the strain gauge $S_1$, and this in turn changes the output voltage $V_{OUT}$.

Figure 9:
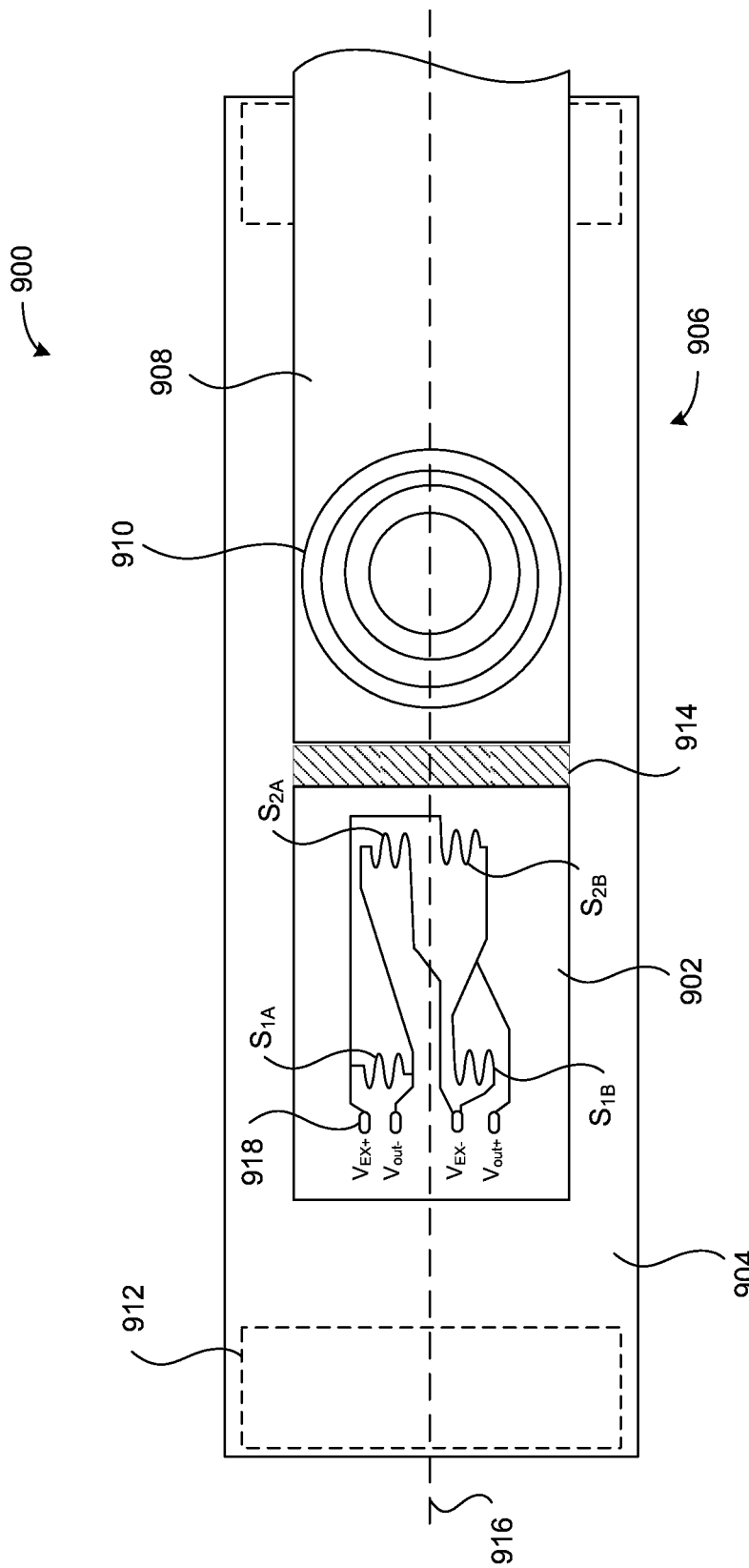
FIG. 9 is a top view of a force sensing switch.

Referring now to FIG. 9, there is shown a top view of a force sensing switch. The force sensing switch 900 includes four strain gauges $S_{1A}$, $S_{1B}$, $S_{2A}$, $S_{2B}$ formed on a common carrier 902. The common carrier 902 can be affixed to the top surface 904 of the deflectable beam 906. In other embodiments, two of the strain gauges can be disposed over the top surface 904 while the other two strain gauges are placed over the bottom surface of the deflectable beam.

A flexible circuit 908 is disposed over the top surface 904 of the deflectable beam 906, and a deformable structure 910 is disposed over the flexible circuit 908. As described earlier, the deformable structure 910 and the flexible circuit 908 are configured as a dome switch. Support structures 912 are shown as dashed lines in FIG. 9 since the support structures are not visible when viewing the force sensing switch from above.

A conductive connector 914 electrically connects $V_{OUT}$, $V_{EX}$, and the four strain gauges $S_{1A}$, $S_{1B}$, $S_{2A}$, and $S_{2B}$ to the flexible circuit 908. The common carrier 902 is aligned with the central X-axis 916 of the deflectable beam 906. The common carrier 902 is placed on the top surface 904 such that the electrical contact pads 918 are closer to an edge of the deflectable beam 906 and further away from the center of the beam. It may be useful to have the electrical contact pads 918 positioned away from the loading position to avoid damage to the pads, although it should be understood that alternative embodiments may orient the common carrier and/or the strain gauges differently.

In the illustrated embodiment, electrical contact pads 918 are connected to nodes 702, 704, 706, 708 shown in FIG. 7, the positive input voltage $V_{EX+}$ is connected to $S_{1A}$ and $S_{2B}$, and the negative input voltage $V_{EX-}$ is connected to $S_{1B}$ and $S_{2A}$. One side of the differential output, negative output $V_{OUT-}$, is connected between $S_{1A}$ and $S_{2A}$. The other side of the differential output, positive output $V_{OUT+}$, is connected between $S_{1B}$ and $S_{2B}$.

Figure 10:
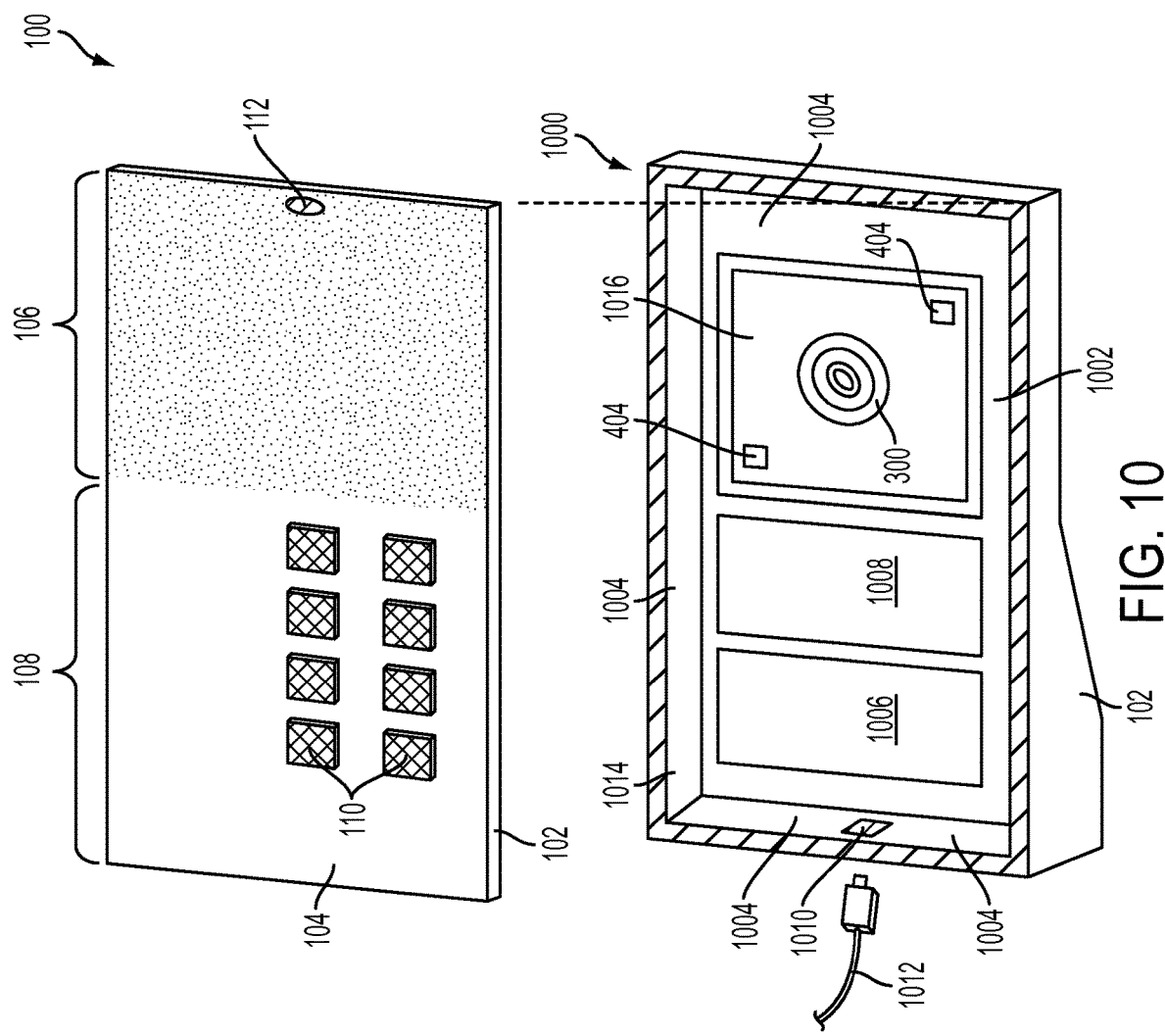
FIG. 10 is a view of the remote control device of FIG. 1 with the glass upper element 104 detached from the housing 102.

FIG. 10 is a view of the remote control device 100 of FIG. 1 with the glass upper element 104 detached from the housing 102. The housing 102 is formed such that an interior cavity 1000 is disposed between the bottom 1002 and the sidewalls 1004 of the housing 102. The housing 102 can be made of any suitable material or materials, such as a metal or a plastic. The interior cavity 1000 can include various structural, electrical and/or mechanical components. For example, the interior cavity 1000 can include a power source such as one or more batteries or rechargeable batteries 1006 and a main logic board 1008. The main logic board can include various integrated circuits in addition to one or more processing devices. For example, the main logic board can include a data storage device, one or more microphones, and other support circuits. One or more wireless communication devices such as an infrared, Bluetooth®, WiFi, or RF device can be included in the interior cavity 1000.

A connector port 1010 can receive an electrical cord or cable 1012 that connects the remote control device 100 to a power source, such as a wall outlet, to charge a rechargeable battery. Additionally or alternatively, the remote control device 100 can be connected to a charging dock to recharge the power source.

A trim 1014 can extend or protrude out along the interior edges of the sidewalls 1004. In some embodiments, a portion of the underside of the glass upper element 104 can be connected to the trim 1014. For example, the bottom surface of the upper element 104 below the second surface 108 can be connected to the housing. The glass upper element 104 can be connected in any suitable manner. For example, an adhesive can be used to affix the glass upper element 104 to the trim 1014. In other embodiments, the underside of the glass upper element can be affixed to the housing in other configurations, such as below the second surface and at least a part of the textured surface.

The underside of the glass upper element 104 below the textured surface 106 is not connected to the trim 1014 in one embodiment. This allows the glass upper element 104 to bend when a force is applied to the textured surface 106. Since a portion of the underside of the upper element is affixed to the housing, the upper element does not pivot but rather bends at or near the interface between the affixed bottom surface and the non-affixed bottom surface. The type of glass or materials used in the glass upper element may limit the bending range such that when a user presses down on the textured surface, the user may not detect any movement in the surface. A force sensing switch 1016 can be disposed on the bottom 1002 of the housing 102 below the textured surface 106. When a force is applied to the textured surface, such as when a finger presses down on the surface, the textured surface bends and the force sensing switch 1016 senses the strain in the deflectable beam. A processing device on the main logic board 1008 can determine the amount of force applied to the textured surface 106 based on a signal or signals produced by one or more strain gauges on the deflectable beam. Although only one force sensing switch is shown, other embodiments can include multiple force sensing switches. For example, a force sensing switch can be positioned under the textured surface 106 and another force sensing switch can be used in combination with at least one input button 110. Additionally or alternatively, two or more force sensing switches can be disposed under the textured surface 106.

Figure 11:
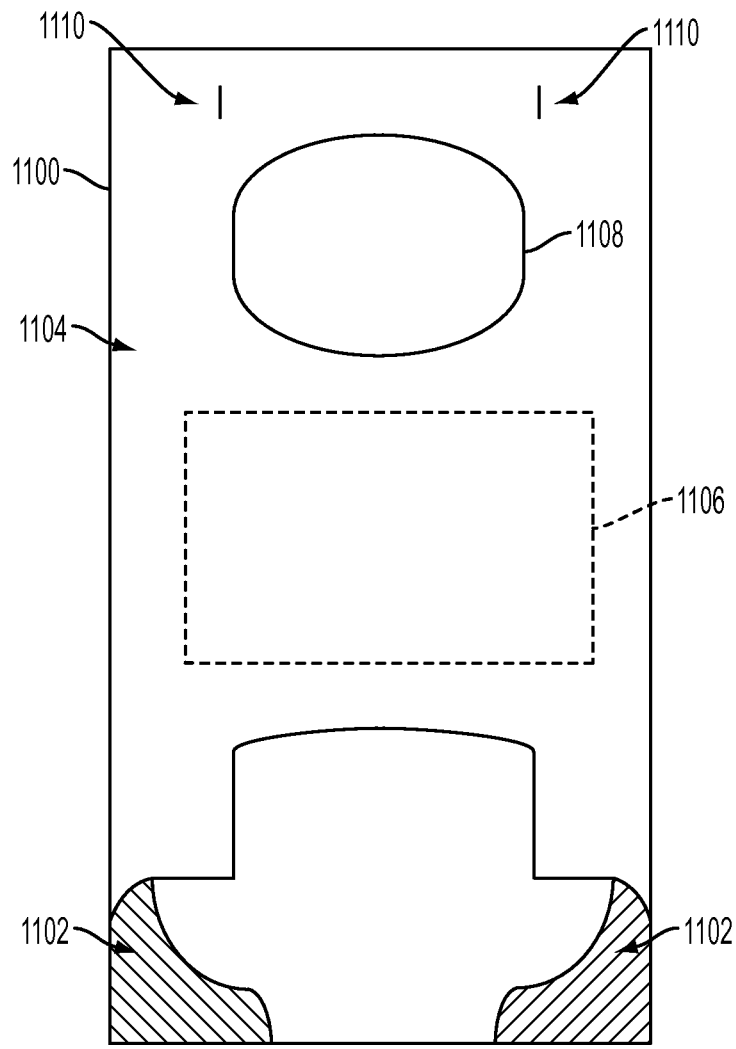
FIG. 11 is a view of one example of a bottom surface of the glass upper element 104 shown in FIG. 10.

Referring now to FIG. 11, there is shown a view of a bottom surface of the glass upper element 104 shown in FIG. 10. A support layer 1100 can be connected to the bottom surface of the glass upper element 104. The support layer 1100 can be made of any suitable material or materials. In one embodiment, the support layer 1100 is made of different plastics. The corner regions 1102 can be formed with a softer plastic, such as, for example, a plastic having a durometer hardness of 50. The remaining areas 1104 of the support layer 1100 can be formed with a harder plastic, such as a glass-filled nylon. The softer corner regions 1102 can provide support and absorb external forces when the remote control device forcibly strikes a surface, such as when the remote control device is dropped.

A button assembly 1106 can be assembled to the underside of the glass upper element 104, between the glass upper element and the support layer 1100. The button assembly 1106 can include the input buttons (110 in FIGS. 1 and 10) and all of the circuitry and components needed for the input buttons to operate. The button assembly 1106 can also assist in positioning and controlling the input buttons relative to the top surface of the glass upper element 104.

An opening 1108 can be formed in the support layer 1100 to thin the support layer 1100 or to expose the underside of the glass upper element 104. The opening 1108 can allow the dome switch of the force sensing switch to be positioned closer to the glass upper element 104. The opening 1108 can also permit the textured surface located above the opening 1108 to more easily bend in response to the force applied to the textured surface.

Since the textured surface 106 is bendable and not affixed to the trim 1014 in some embodiments, fasteners 1110 can be molded or formed on the support layer 1100 to mechanically engage with the trim 1014 or housing 102 and prevent the textured surface 106 from being lifted or pulled away from the housing 102. For example, the fasteners 1110 can include a hook shape that engages with the edge of the trim, or that is received by openings in the trim 1014. Other embodiments can use fewer or more fasteners, and the fasteners can be configured in any given shape. Additionally or alternatively, the fasteners can be formed with the housing and engage with the support layer 1100.

Figure 12:
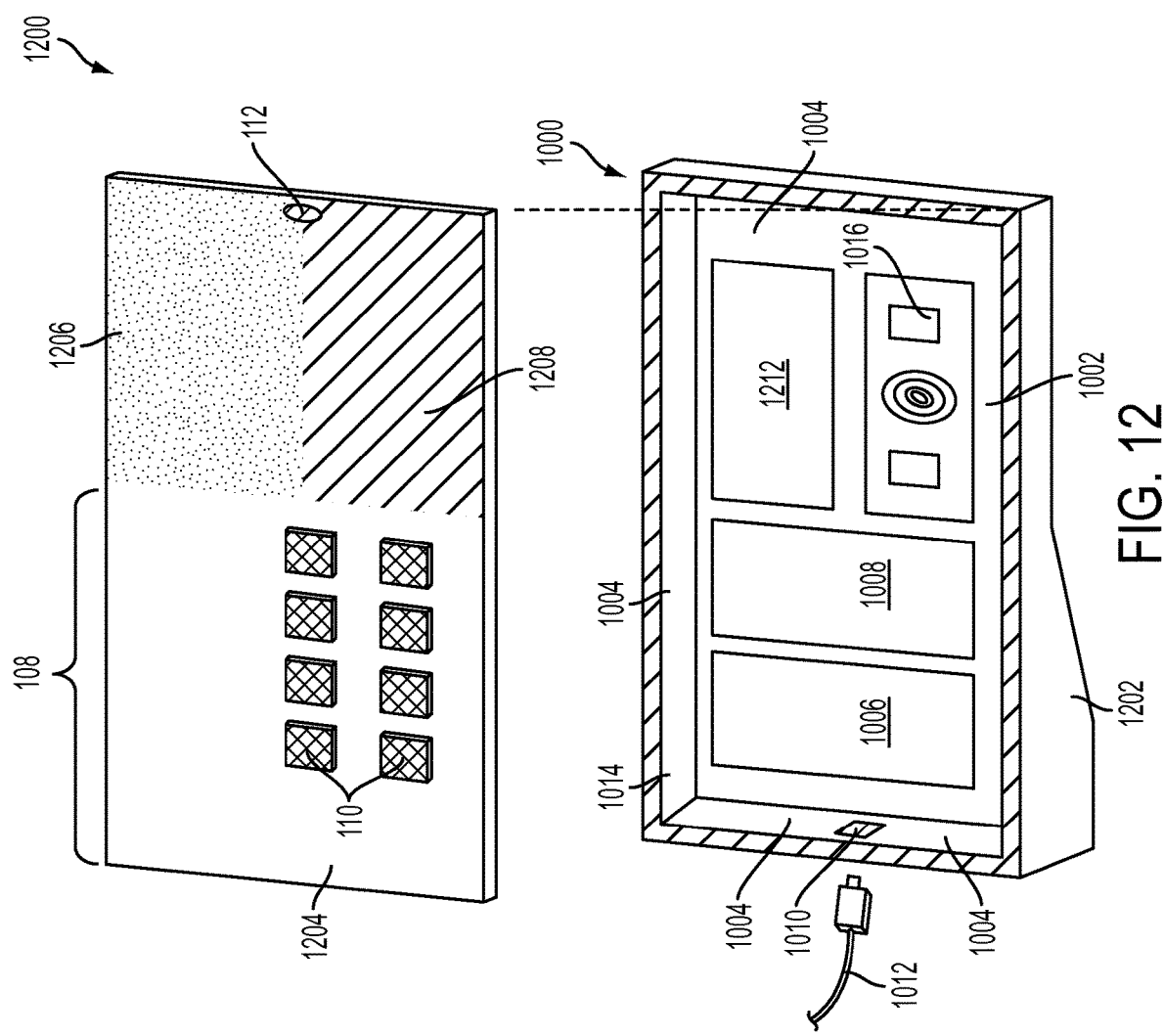
FIG. 12 is a view of another example of a remote control device with the glass upper element detached from the housing.

Referring now to FIG. 12, there is shown a view of another example of a remote control device with the glass upper element detached from the housing. The remote control device 1200 can include some of the same elements and components as the remote control device 1000 in FIG. 10. For simplicity, reference numbers identical to those in FIG. 10 are used for the like element and components, and these features are not described in detail with respect to FIG. 12.

The remote control device 1200 includes a housing 1202 and a glass upper element 1204. Although the upper element 1204 is described as a glass upper element, other embodiments can form the upper element with a different material or combination of materials. The glass upper element 1204 is partitioned to include three different frictionally engaging surfaces, including a first textured surface 1206, a second textured surface 1208, and the second surface 108. The first and second textured surfaces can have substantially the same dimensions, or the two surfaces can have different dimensions. Additionally, the second surface 108 can have the same or different dimensions as one or both textured surfaces. The first textured surface 1206, the second textured surface 1208, and the second surface 108 can be positioned at locations other than the locations shown in FIG. 12.

The first and second textured surfaces 1206 and 1208 can be used for user inputs, such as a touch and/or a force input. An input device 1212 can be positioned under one of the textured surfaces, such as the first textured surface 1206, while a force sensing switch 1016 can be positioned under the other textured surface (e.g., surface 1208). For example, in one embodiment, the input device 1212 can be a trackpad that a user interacts with using the first textured surface 1206. In another embodiment, the input device 1212 can be any suitable type of touchscreen with the first textured surface 1206 being a transparent upper element glass that a user touches to interact with icons, buttons, or menus displayed on the screen. And in a third embodiment, the force sensing switch 1012 can be omitted and two different input devices, such as a trackpad and a touchscreen, can be included in the remote control device 1200.

Figure 13:
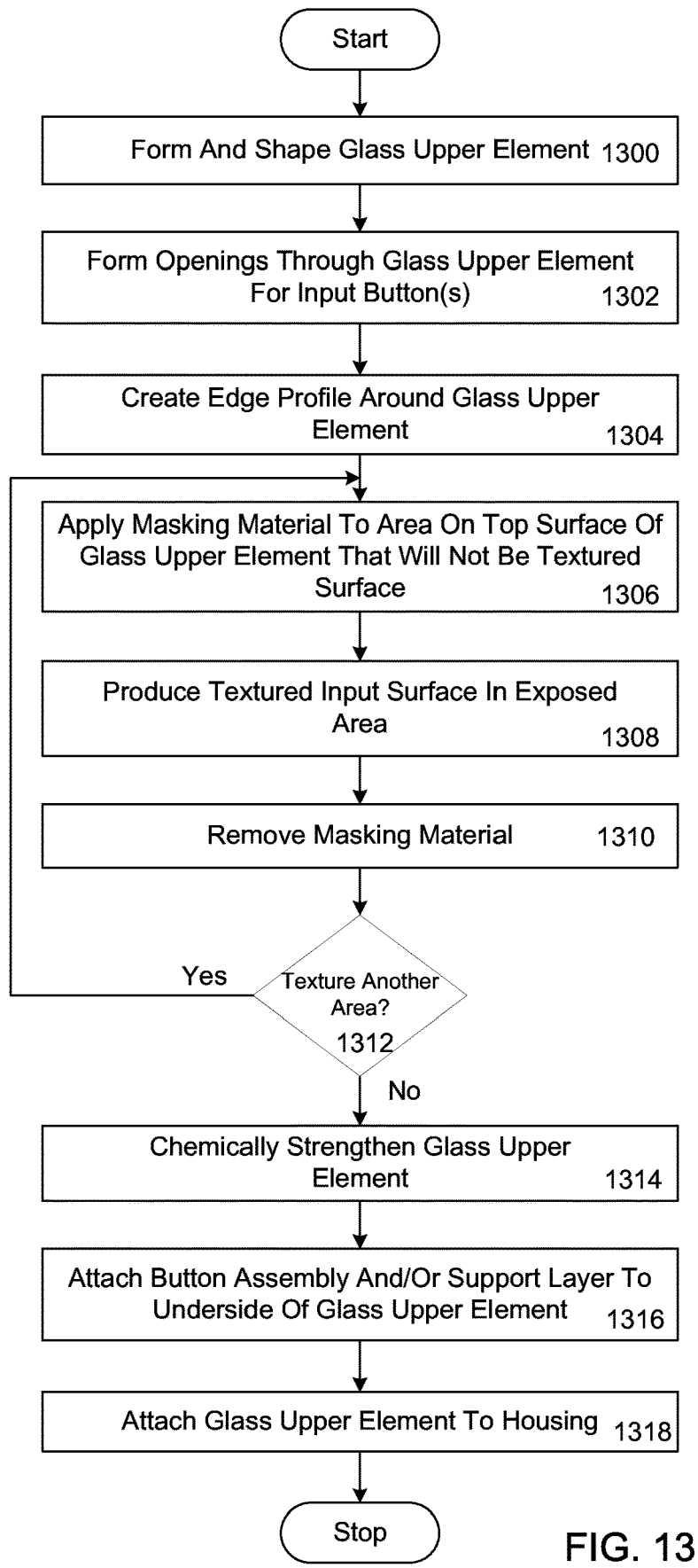
FIG. 13 is a flowchart of a method for producing the glass upper element shown in FIGS. 10-12.

FIG. 13 is a flowchart of a method for producing the remote control device shown in FIGS. 10-12. Initially, the glass upper element is formed and shaped, as shown in block 1300. The glass upper element can be made of an aluminum silicate composite material in one or more embodiments. The openings for the one or more input buttons can then be formed through the glass upper element (block 1302). Next, as shown in block 1304, an edge profile can be created around the side edges of the glass upper element. In some embodiments, the side edges of the glass upper element are fully exposed in that a housing or frame does not surround the glass upper element. Thus, the side edges can be shaped to create an edge profile. For example, the side edges can be cut by a cutting tool to have a rounded edge profile, similar in shape to one or more parentheses "( )" or the letter "c" in one or more embodiments.

A masking material is then applied to the area of the top surface of the glass upper element that will not be subsequently textured (block 1306). A textured surface can be produced in any given shape and at any location, and the masking material can be used to define the shape and/or location of the textured surface. Next, as shown in block 1308, the exposed area of the top surface of the glass upper element not covered by the masking material is then etched to form a textured surface.

The type of masking material used in block 1306 may depend on the etching process used in block 1308. By way of example only, if a sandblasting method is used to produce the textured surface, the masking material can be a removable vinyl adhesive. Alternatively, if a chemical etch process is used as the etching process, the masking material can be a resist material, such as a photoresist.

After the textured surface is formed, the masking material is removed, as shown in block 1310. As described in conjunction with FIG. 12, the remote control device can include multiple textured surfaces. In some embodiments, the textured surfaces can be implemented as textured surfaces that have substantially the same texture or feel to a user. In these embodiments, the masking material applied at block 1306 can be applied in a manner that exposes the areas and locations that will be the textured surfaces having the same texture or feel.

In other embodiments, the multiple textured surfaces can have a different texture or feel to the user. Distinct textured surfaces that feel different to a user can assist the user in identifying the input device positioned below a respective textured surface. In these embodiments, the method can include a determination at block 1312 as to whether or not another area of the top surface of the glass upper element is to be a textured surface having a different texture or feel. If so, the method returns to block 1306. Blocks 1306, 1308, and 1310 repeat until all of the textured surfaces have been formed.

When all of the textured surfaces have been produced, the process passes to block 1314 where the glass upper element is chemically strengthened. Chemically strengthening the glass upper element can help prevent cracks from forming in the glass upper element, and can reduce the probability that the glass upper element will chip or break. Next, as shown in block 1316, the button assembly and/or the support layer can then be attached to the glass upper element. If both are to be attached to the glass upper element, the button assembly can be attached first followed by the support layer.

The glass upper element is then affixed to the housing to produce the remote control device. As described earlier, only a portion of the bottom surface of the glass upper element can be affixed to the housing, or to the trim in the housing in some embodiments. Connecting only the underside of the second surface to the housing allows the textured surface to bend in response to an applied surface. In other embodiments, the underside of the glass upper element can be connected to the housing differently. For example, the bottom surface of the glass upper element below the second surface and below at least a portion of the textured surface can be affixed to the trim or housing.

The method shown in FIG. 13 can be performed differently in other embodiments. Blocks can be added or deleted, or performed in a different order. By way of example only, block 1312 can be omitted in embodiments where only one textured surface is formed, or when multiple textured surfaces having the same texture are formed on the top surface of the glass upper element. Alternatively, block 1312 can be omitted in embodiments where the upper element is made of a material other than glass.

Figure 14:
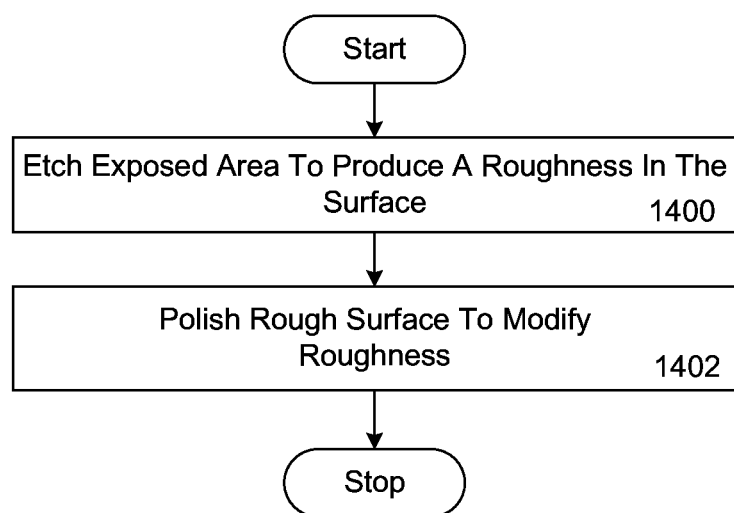
FIG. 14 is a flowchart of a method for producing a textured surface in block 1308 of FIG. 13.

FIG. 14 is a flowchart of a method for producing a textured surface in block 1308 of FIG. 13. The illustrated process comprises a two-step process. In the first step, the exposed area is etched to produce a roughness in the surface of the exposed area (block 1400). The rough surface is then polished, as shown in block 1402, to modify the roughness. For example, the polish can smooth out the roughness such that the sharpness of the irregular surface is reduced to lower the friction coefficients.

Figure 15:
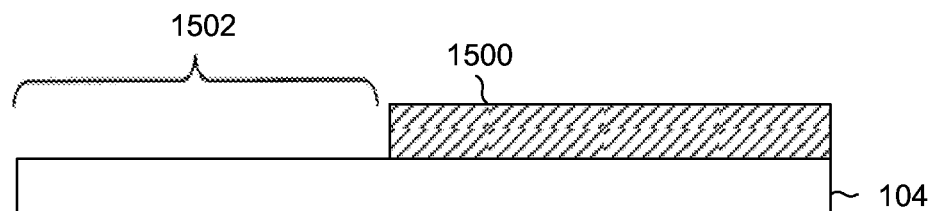
FIG. 15 depicts a glass upper element after block 1306 in FIG. 13 is performed.
Figure 16:
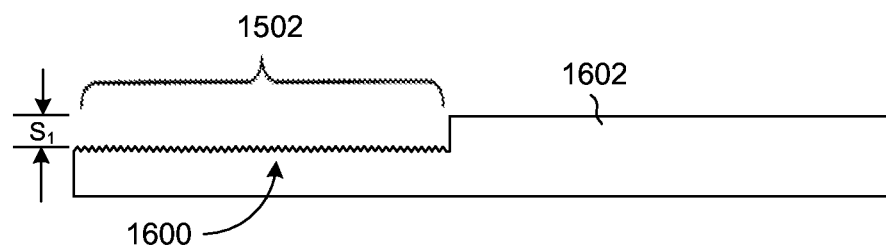
FIG. 16 illustrates the glass upper element 1502 after block 1310 in FIG. 13 is performed.

FIG. 15 depicts a masking material 1500 applied to a portion of the top surface of the glass upper element 104. The exposed portion 1502 is an area of the glass upper element that will be a textured surface. In a prior art method, a chemical etch is used in block 1400 (FIG. 14) to etch the exposed portion 1502 and produce a roughness 1600 in the surface of the exposed portion. However, as shown in FIG. 16, the chemical etch also etches or removes some of the glass upper element 104 in the exposed portion 1502, resulting in a noticeable step S1 between the top surface of the exposed portion 1502 and the top surface of the portion 1602 that was protected by the masking material. The step S1 can be noticeable to a user, and in some situations, may be objectionable to the user as the user handles or moves his or her fingers over the glass upper element.

Figure 17:
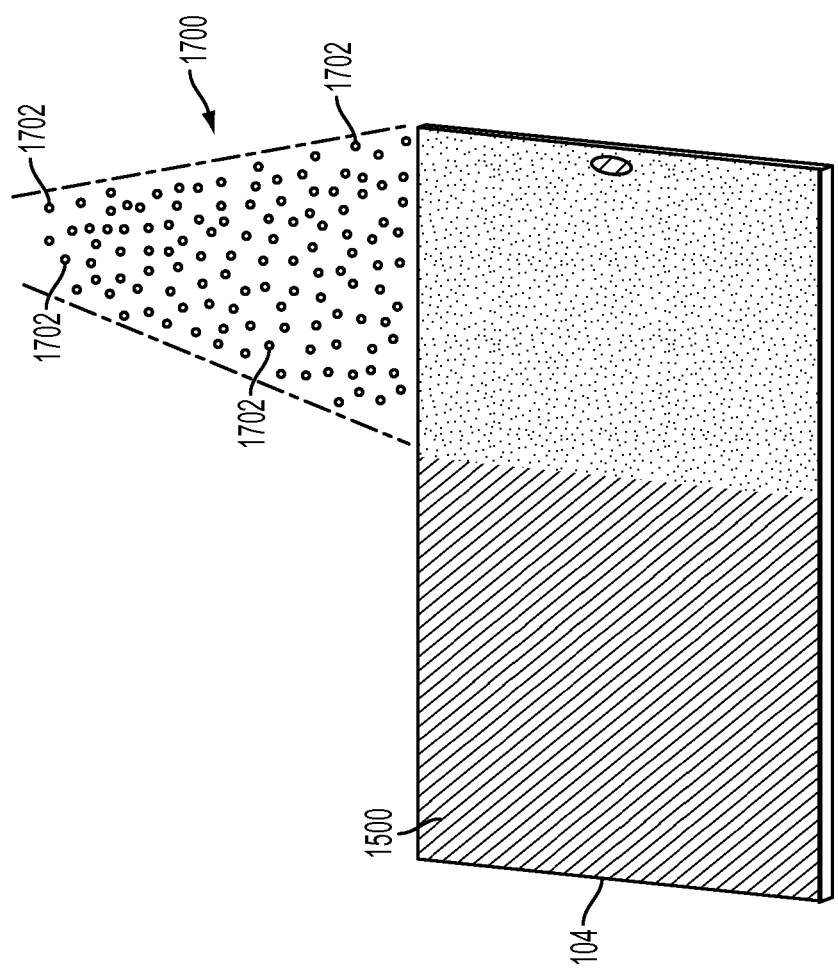
FIG. 17 depicts a method for abrasively etching a glass upper element.

Instead of using a chemical etch in block 1400, one embodiment described herein uses an abrasive etch that includes abrasive particles. The abrasive particles can be mixed in with a liquid. The liquid is the carrier for the abrasive particles and applies the abrasive particles against the surface of the exposed portion at the desired amount of pressure. FIG. 17 illustrates a method for abrasively etching a glass upper element. The masking material 1500 is applied to a portion of the top surface of the glass upper element 104. A mixture 1700 of the liquid and the abrasive particles 1702 can be applied to the exposed portion of the top surface to produce a roughness in the top surface. By way of example only, the abrasive particles can be glass beads, the liquid may be water, and the mixture can be jetted from a nozzle onto the exposed portion of the top surface. The diameter of the glass beads can be based on the desired roughness. For example, the diameter of the glass beads can be an ultra-fine micro-grit with an average particle diameter of 10.3 or a 1000 grit designation. In one embodiment, the ultra-fine micro-grit glass beads produce a surface roughness of less than 100 Ra, where Ra is the average roughness expressed in nanometers. In other embodiments, the diameter of the glass beads can be larger to produce a different surface roughness Ra. For example, larger diameter glass beads can be used to form a surface roughness of 500-1000 in a surface.

The amount of abrasive particles and the amount of liquid in a mixture can be based on the desired roughness to be formed in a surface, and/or on the amount of polish to be used in block 1402 of FIG. 14. Additionally or alternatively, the size and the shape of the abrasive particles can be different in other embodiments.

In some embodiments, at least a portion of the abrasive particles (e.g., the glass beads) can be recycled and used again when producing one or more additional glass upper elements. For example, the glass beads can be separated from the water with a filter and a percentage of previously-used glass beads can be mixed in with new glass beads when forming another glass upper element.

In another embodiment, a mechanical polish can be used in block 1400 of FIG. 14 instead of the abrasive etch to produce a desired surface roughness. For example, a compound can be applied to the exposed surface of the glass upper element with a pad. The combination of the pad and the compound can produce the roughness in the surface.

Figure 18:
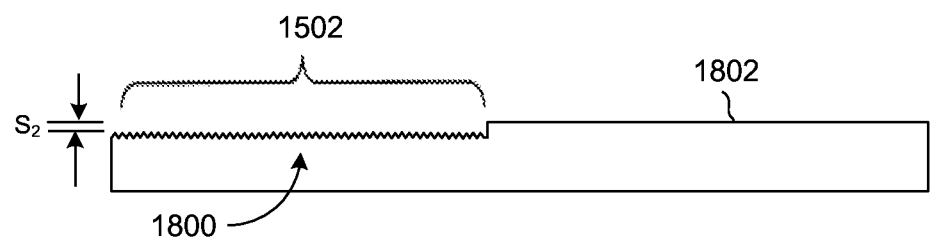
FIG. 18 illustrates the glass upper element after the abrasive etch is performed.

FIG. 18 illustrates the glass upper element after the abrasive etch is performed. A roughness 1800 is formed in a portion of the top surface of the glass upper element 104, and the upper element has a smaller step S2 than the step S1 shown in FIG. 16. The smaller step S2 may not be noticeable, or may be less noticeable to a user than the step S1.

Although a glass upper element has been used to describe various techniques for forming a roughness in the surface of the glass upper element, other embodiments are not limited to this construction. A roughness can be produced in different types of materials or surfaces. By way of example only, a roughness can be formed in a plastic or metal surface, or the surface can be used in a different type of product, such as, for example, in the exterior surface of a trackpad, the keys in a keyboard, input buttons, a surface of a mouse, or any other surface that a user interacts with.

Figure 19:
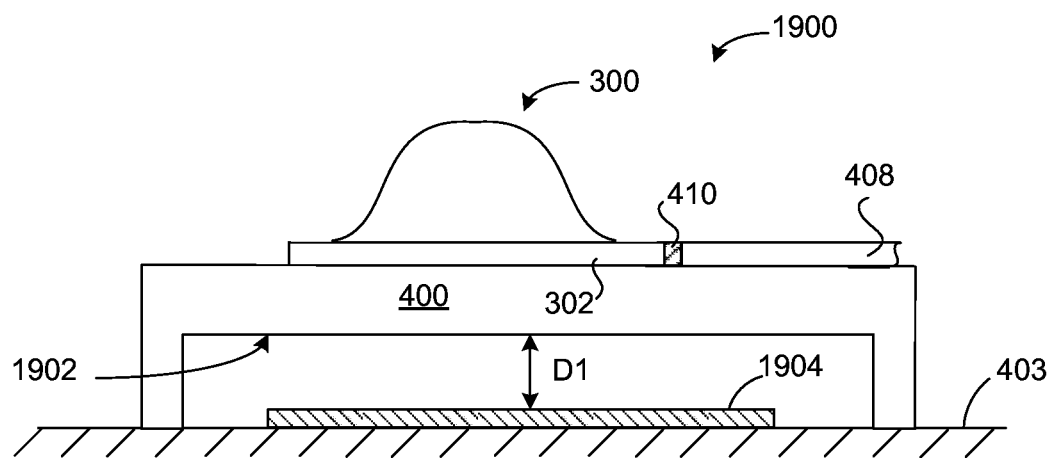
FIGS. 19-20 are simplified cross-section views of another example of a force sensing switch suitable for use in a remote control device.
Figure 20:
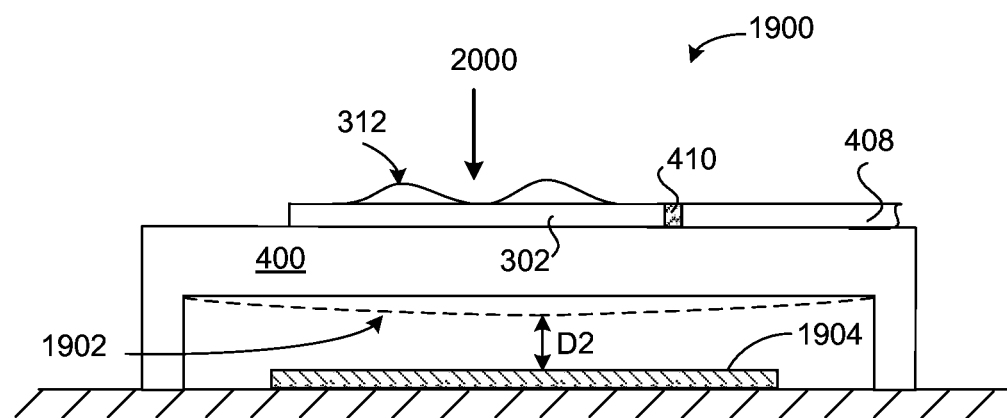

Referring now to FIGS. 19 and 20, there are shown simplified cross-section views of another example of a force sensing switch that is suitable for use in a remote control device. FIG. 19 depicts the force sensing switch in an unactuated state. Some of the elements included in the force sensing switch 1900 are the same elements that are shown in FIG. 4. For simplicity, these identical elements are not described in detail.

The force sensing switch 1900 detects force by measuring capacitance changes between the bottom surface 1902 of the deflectable beam 400 and an electrode 1904 disposed under the deflectable beam and over the support structure 403. The electrode 1904 can be made of any suitable material, such as, for example, a metal. The combination of the bottom surface 1902 of the deflectable beam 400 and the electrode 1904 forms a capacitive sensing element.

The gap or distance between the bottom surface 1902 and the electrode 1904 is D1 when the force sensing switch is in an unactuated state. When a downward force (represented by arrow 2000 in FIG. 20) is applied to an input surface (not shown), the downward force is also applied to the deformable structure 312 and to the deflectable beam 400. The downward force can be sufficient to collapse the deformable structure 312 and actuate the dome switch, or the force can be insufficient to actuate the dome switch but still compress the deformable structure 312. Either way, the deformable structure 312 compresses and the deflectable beam 400 deflects based on the applied force. The beam deflection changes the distance between the bottom surface 1902 of the deflectable beam and the electrode 1904. In the illustrated embodiment, the distance decreases to D2. The change in distance results in a capacitance change between the bottom surface 1902 and the electrode 1904. The measured capacitance can be calibrated as a function of applied force and used as a force sensor.

Figure 21:
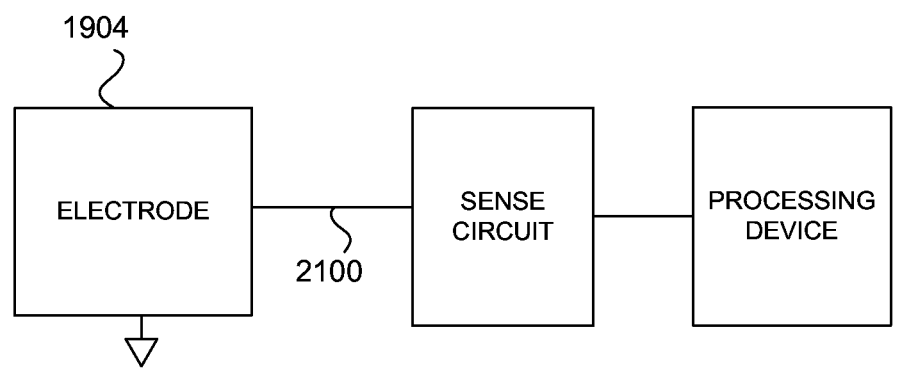
FIG. 21 is a block diagram of one example of a self-capacitance sensing system suitable for use with the force sensing switch shown in FIGS. 19-20.

The capacitive sensing element formed by the bottom surface 1902 and the electrode 1904 can operate in a self-capacitance mode or in a mutual capacitance mode. In a mutual capacitance mode, the electrode 1904 can be driven with an excitation signal and a sense line connected to the electrode 1904 scanned to measure the capacitance between the bottom surface 1902 and the electrode 1904. When the capacitive sensing element operates in a self-capacitance mode, the capacitance is measured with respect to a reference signal or voltage. FIG. 21 is a block diagram of a self-capacitance sensing system that is suitable for use with the force sensing switch shown in FIGS. 19-20. The electrode 1904 can be connected to a reference voltage, such as ground. A sense circuit scans a sense line 2100 connected to the electrode to measure the capacitance between the bottom surface 1902 and the electrode 1904. A processing device connected to the sense circuit can direct the sense circuit to scan, and can receive the measurement from the sense circuit and determine the amount of force applied to the input surface based on the measurement.

Various embodiments have been described in detail with particular reference to certain features thereof, but it will be understood that variations and modifications can be effected within the spirit and scope of the disclosure. For example, an input device such as a force sensing switch has been described as being positioned below a textured surface. Other embodiments are not limited to this configuration, and an input device can be disposed under the second surface. As another example, a processing device may not be included in a remote control device having one or more force sensing switches. Instead, the remote control device can be operatively connected to a processing device and the strain measurements by a force sensing switch or switches can be transmitted to the processing device using a wired or wireless connection. Additionally or alternatively, other embodiments can include additional structural, electrical and/or mechanical components in a remote control device. For example, a stiffener plate can be disposed between the glass upper element and the bottom of the housing to provide additional structural support.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. A controller for an external electronic device, the controller comprising:
 a housing comprising a bottom surface;
 an upper element having a first surface and a second surface;
 an input device configured to receive touch input through the first surface of the upper element;
 a switch positioned in the housing, a portion of the first surface being bendable relative to the second surface toward the bottom surface to actuate the switch; and
 a transmitter configured to transmit signals to the external electronic device.

2. The controller of claim 1, further comprising:
 a set of buttons provided in the second surface of the upper element, the set of buttons including at least one button having a raised surface relative to the second surface and at least one additional button having a recessed surface relative to the second surface;
 an orientation sensor in the housing configured to detect an orientation of the controller;
 a processing device in the housing, the processing device configured to receive a first signal from the switch, a second signal from the input device, and a third signal from the orientation sensor; and wherein the first and second surfaces have a different visual appearance.

3. The controller of claim 1, further comprising a set of buttons in the second surface, the set of buttons including at least one button having a raised surface relative to the second surface, the set of buttons including at least one button having a recessed surface relative to the second surface.

4. The controller of claim 1, wherein a set of buttons extends through a set of openings in the second surface.

5. The controller of claim 1, wherein the first and second surfaces each comprise different frictionally engaging textures.

6. The controller of claim 1, further comprising adjoining side surfaces extending from the bottom surface to form an interior cavity, wherein the first surface is deflectable into the interior cavity.

7. The controller of claim 1, wherein the first surface is deflectable into a space between a bottom-facing surface of the upper element and a set of side surfaces of the housing.

8. The controller of claim 1, further comprising an orientation sensor in the housing configured to detect an orientation of the controller.

9. The controller of claim 1, further comprising a processing device in the housing, the processing device configured to receive a signal from the switch.

10. The controller of claim 1, wherein the controller comprises a cable opening positioned on an opposite side of the second surface relative to the first surface.

11. The controller of claim 1, wherein deflecting the first surface decreases an overall thickness of the controller.

12. A method, comprising:
receiving a touch input at a controller for an electronic device, the controller comprising an upper element, a bottom housing, a switch, and a processor;
receiving, at the processor, a first signal upon provision of the touch input at a first surface of the upper element;
bending the first surface toward the bottom housing and toward the switch; and
receiving, at the processor, a second signal from the switch upon deflection of the first surface.

13. The method of claim 12, further comprising sending, via the processor, a control signal to the electronic device.

14. The method of claim 12, wherein deflecting the first surface toward the switch comprises deflecting the upper element toward a housing in which the switch is positioned.

15. The method of claim 12, further comprising detecting an orientation of the controller using a gyroscope.

16. The method of claim 12, wherein deflecting the first surface toward the switch comprises deflecting a portion of the first surface that is sensitive to touch input.

17. A controller for an external electronic device, the controller comprising:
a housing having a bottom portion;
an upper element coupled with the housing, the upper element having a surface, the surface including a first portion and a second portion;
an input device configured to receive touch input through the surface of the upper element;
a switch positioned in the housing between the bottom portion and the upper element, the first portion of the surface of the upper element being bendable relative to the second portion toward the bottom portion to actuate the switch;
a transmitter configured to transmit signals to the external electronic device;
an orientation sensor in the housing configured to detect an orientation of the housing; and
a processing device in the housing to receive a first signal from the switch, a second signal from the input device, and a third signal from the orientation sensor.

18. The controller of claim 17, wherein the surface of the upper element includes a first area and a second area, the first and second areas having different frictionally engaging textures.

19. The controller of claim 17, further comprising a set of buttons in the upper element, the set of buttons including at least one button having a raised surface relative to the surface of the upper element, the set of buttons including at least one button having a recessed surface relative to the surface of the upper element.

* * * * *